United States Patent [19]

Nakajima et al.

[11] Patent Number: 5,661,429
[45] Date of Patent: Aug. 26, 1997

[54] BI-CMOS CIRCUIT

[75] Inventors: Takao Nakajima, Ebina; Takayuki Harima, Kawaguchi; Makoto Segawa, Yokohama, all of Japan

[73] Assignee: Kabushiki Kaisha Toshiba, Tokyo, Japan

[21] Appl. No.: 423,613

[22] Filed: Apr. 17, 1995

[30] Foreign Application Priority Data

Apr. 15, 1994 [JP] Japan .................... 6-077161

[51] Int. Cl.[6] .................... H03K 19/02; H03K 17/60; H03K 17/16

[52] U.S. Cl. .................... 327/379; 327/384; 327/433; 327/84; 327/110

[58] Field of Search .................... 327/108, 379, 327/384, 112, 380, 381, 383, 389, 432, 433, 434, 437; 326/84, 85, 104, 109, 110

[56] References Cited

U.S. PATENT DOCUMENTS

| | | | |
|---|---|---|---|
| 4,730,132 | 3/1988 | Watanabe et al. | 326/110 |
| 5,013,936 | 5/1991 | Shiomi et al. | 326/84 |
| 5,030,860 | 7/1991 | Tran | 326/84 |
| 5,079,447 | 1/1992 | Lien et al. | 326/84 |
| 5,095,229 | 3/1992 | Yun et al. | 326/84 |
| 5,140,190 | 8/1992 | Yoo et al. | 326/84 |
| 5,159,214 | 10/1992 | Okumura | 326/84 |
| 5,182,472 | 1/1993 | Ando | 326/84 |
| 5,243,237 | 9/1993 | Khieu | 326/84 |
| 5,254,885 | 10/1993 | Ando | 326/110 |
| 5,365,124 | 11/1994 | Seta et al. | 326/84 |

Primary Examiner—Timothy P. Callahan
Assistant Examiner—T. Lam
Attorney, Agent, or Firm—Loeb & Loeb LLP

[57] ABSTRACT

A BiCMOS circuit includes a CMOS circuit for inverting data applied to an input terminal and a first bipolar transistor, having a base connected to an output point of this CMOS circuit, a collector connected to a power supply voltage and an emitter connected to an output terminal, for charging the output terminal. The BiCMOS circuit also includes a second bipolar transistor, having a collector connected to the output terminal, for discharging the output terminal, a first MOS transistor of a first conductivity type connected in parallel between the base and the collector of the second bipolar transistor and a second MOS transistor of the first conductivity type connected in series with the first MOS transistor and having a gate connected to an output point of the CMOS circuit. The Bi-CMOS circuit further includes a third MOS transistor of the first conductivity type connected between the input terminal and the gate of the first MOS transistor of the first conductivity type and having a gate receiving a first reference voltage, and a fourth MOS transistor of a second conductivity type connected between the first reference voltage and the gate of the first MOS transistor. A large variation width of an output voltage can be ensured, and hence the Bi-CMOS circuit normally operates even at a low voltage without any deterioration in terms of delay time.

29 Claims, 8 Drawing Sheets

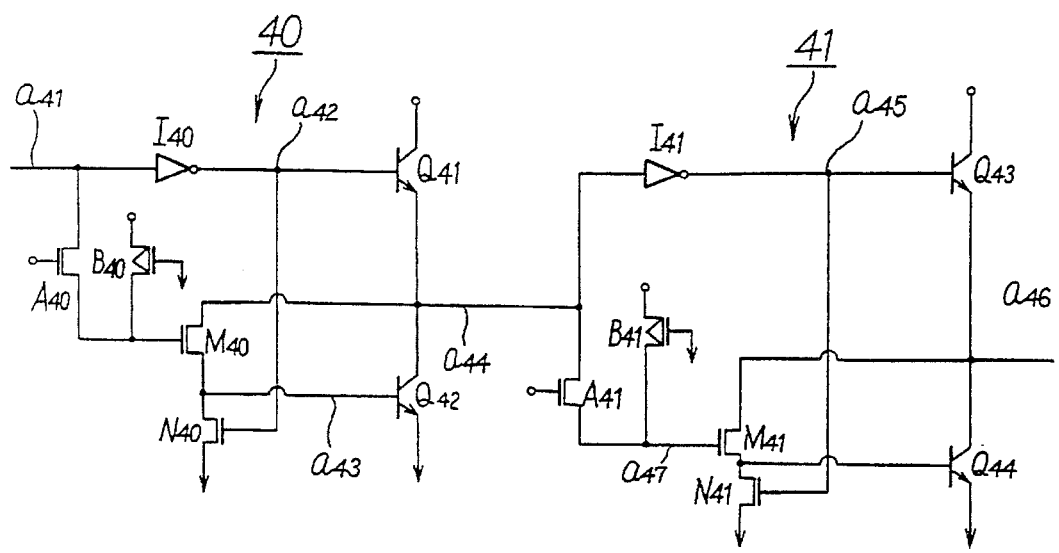
F I G. 3
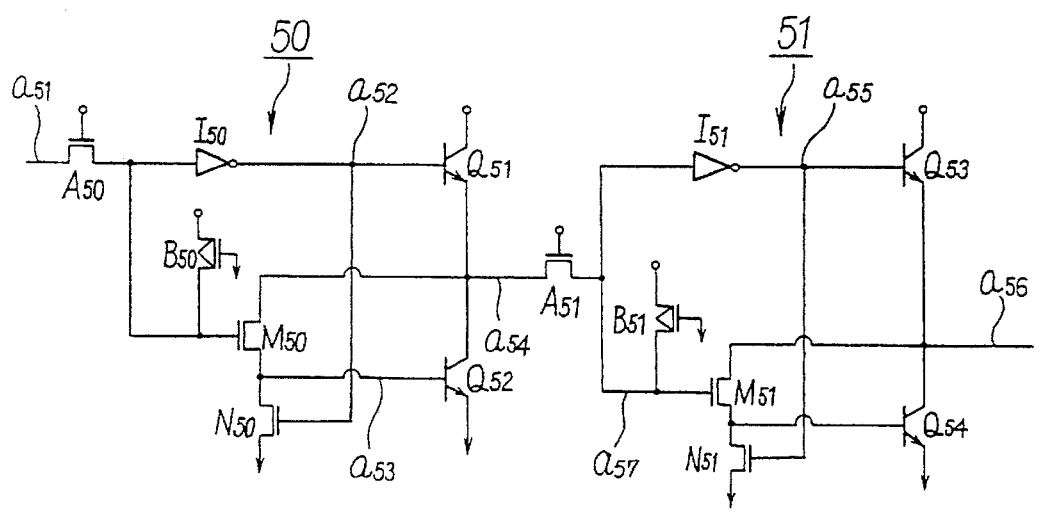
F I G. 4

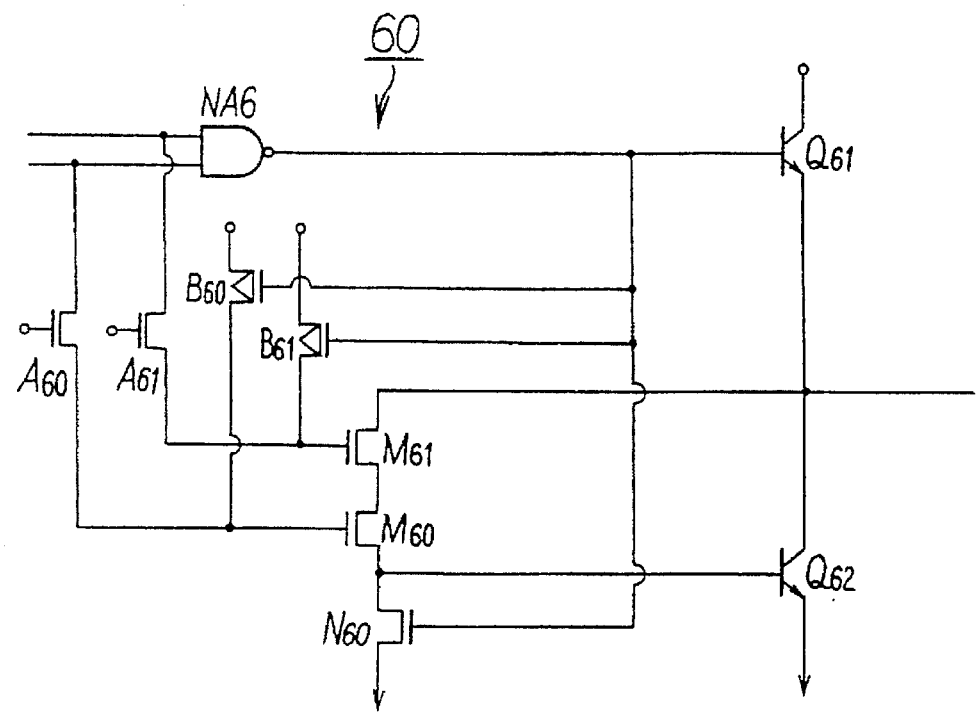
F I G. 5
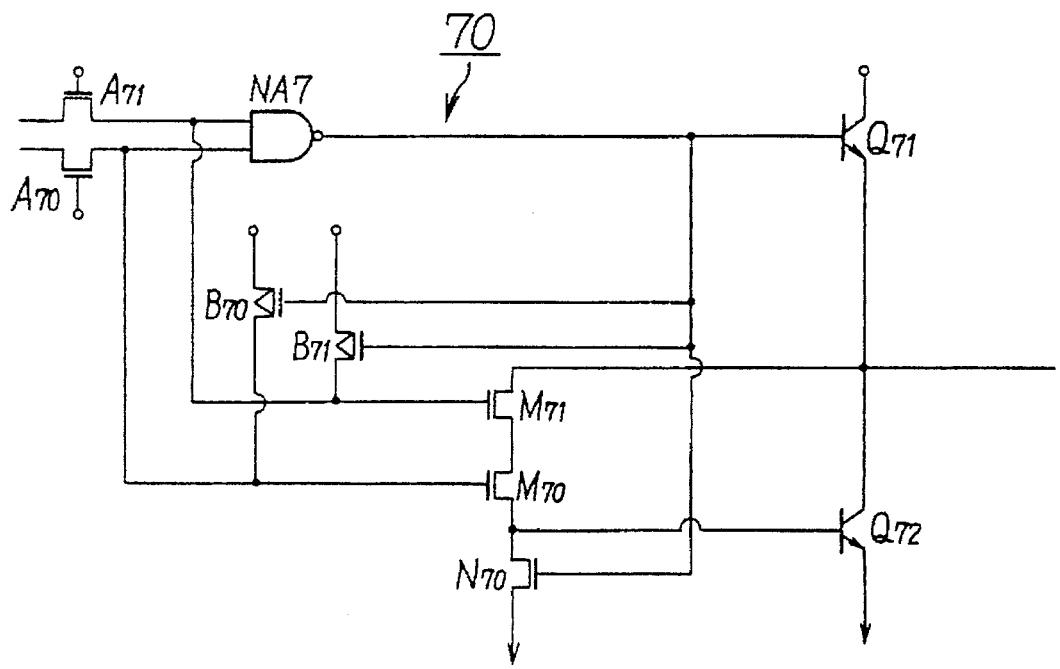
F I G. 6

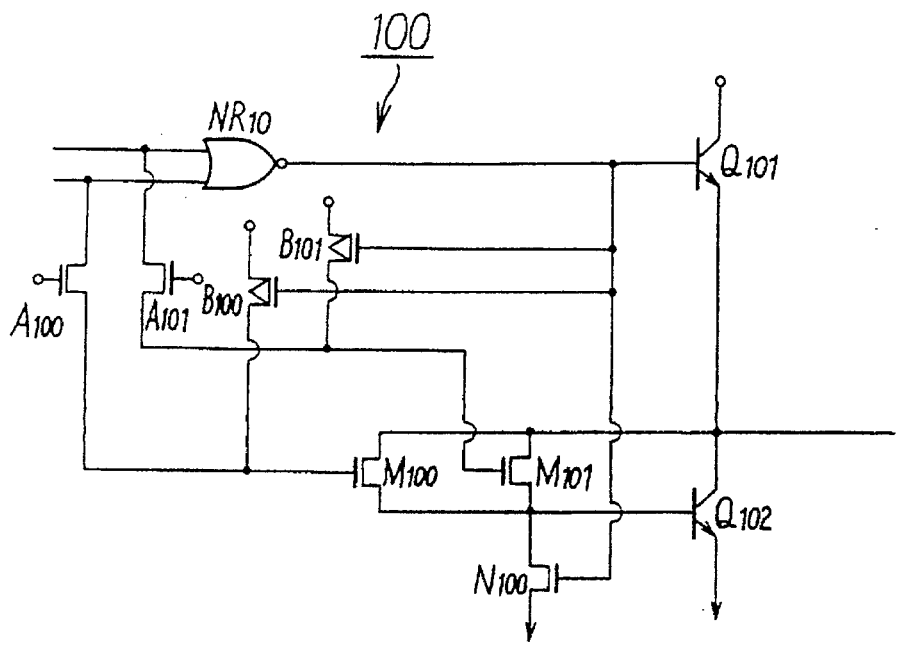
F I G. 9
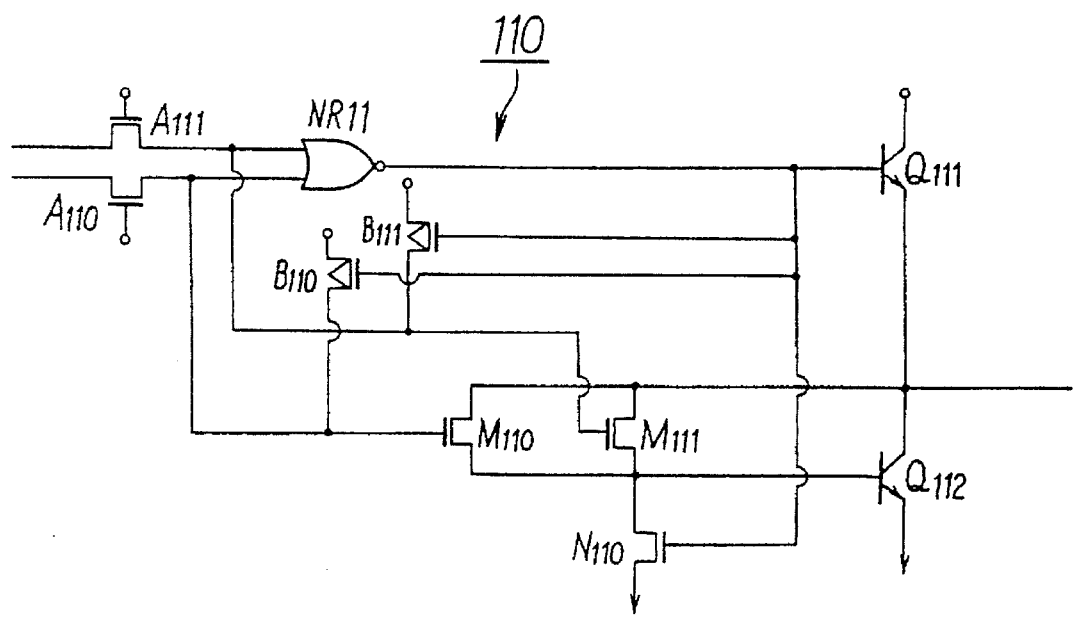
F I G. 10

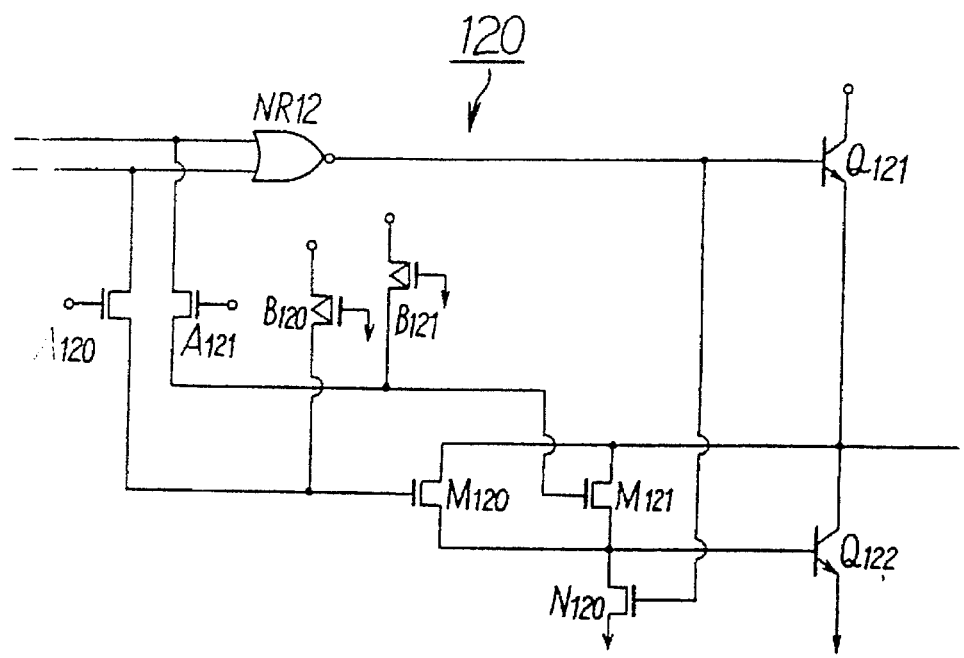
F I G. 11
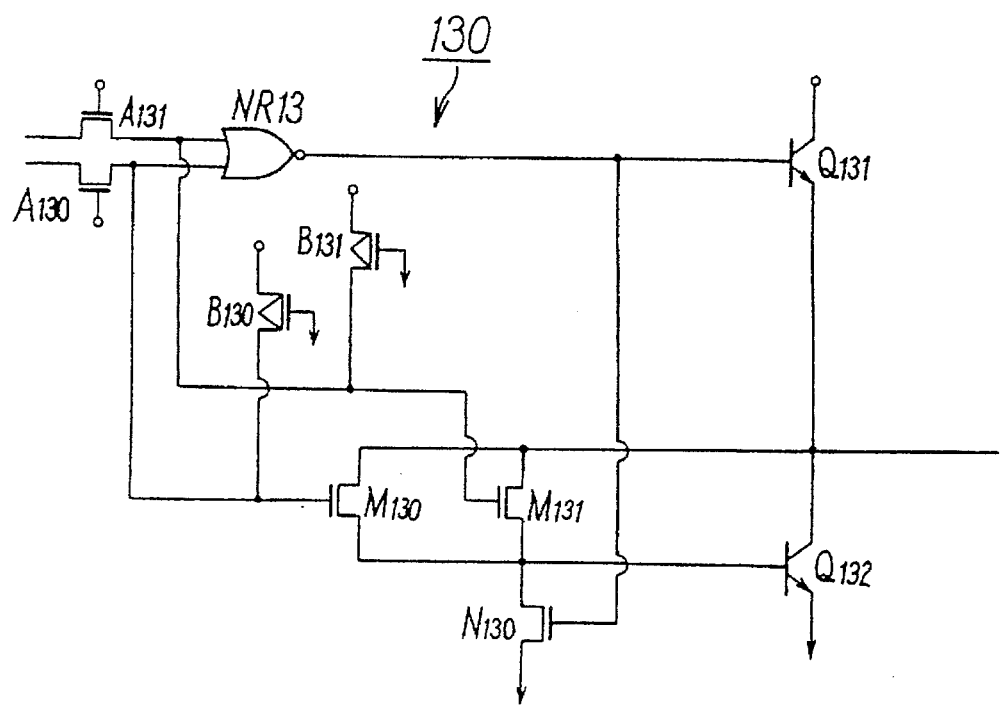
F I G. 12

BI-CMOS CIRCUIT

BACKGROUND OF THE INVENTION

1. Field of the Invention

The present invention relates generally to a so-called Bi-CMOS circuit in which a bipolar transistor and a CMOS transistor are combined and, more particularly, to a Bi-CMOS circuit suitable for use with a semiconductor memory device operating at a low voltage with a high speed.

2. Description of the Background Art

A Bi-CMOS circuit where bipolar circuits and CMOS circuits are combined is often employed for the purpose of speeding-up in a semiconductor memory device.

FIG. 14 is a circuit diagram of one example of the Bi-CMOS circuit, which illustrates a configuration wherein two Bi-CMOS inverter circuits 10, 11 are connected in series. NPN type bipolar transistors Q11, Q12 of a first-stage inverter and NPN type bipolar transistors Q13, Q14 of a second-stage inverter are respectively connected in series. The Bi-CMOS inverter circuits 10, 11 include a CMOS inverter I10 for controlling a base of the bipolar transistor Q11 and a CMOS inverter I11 for controlling a base of the bipolar transistor Q13. Further, N-channel MOS (NMOS) transistors M10, N10 are connected in series between the ground and a connecting point between an emitter of the bipolar transistor Q11 and a collector of the bipolar transistor Q12. Similarly, transistors M11, N11 are connected in series between the ground and a connecting point between an emitter of the bipolar transistor Q13 and a collector of the bipolar transistor Q14. A gate of the NMOS transistor M10 is connected to an input point a11 which is common to the inverter I10. A gate of the NMOS transistor M11 is connected to an input point a14 common to the inverter I11. A gate of the NMOS transistor N10 is connected to an output point a12 of the inverter I10. A gate of the NMOS transistor N11 is connected to an output point a15 of the inverter I11. Further, a connecting point between the NMOS transistors M10 and N10 is connected to a base of the bipolar transistor Q12. A connecting point between the NMOS transistors M11 and N11 is connected to a base of the bipolar transistor Q14.

Next, the operation of this circuit will be explained.

When a voltage of an [H] level is applied to the input point a11 of the CMOS inverter I10, which serves as an input point of the Bi-CMOS inverter circuit 10, a voltage of an [L] level is outputted to the output point a14. The following is the reason for this. When the input point a11 is at the [H] level, both the bipolar transistor Q11 and the NMOS transistor N10 are switched off, whereas the NMOS transistor M10 is switched ON. Hence, when a base a13 of the bipolar transistor Q12 is charged with a voltage up to Vbi, the bipolar transistor Q12 is switched ON, and discharging takes place from the output point a14, resulting in a drop of its electric potential. At this time, however, the voltage at the output point a14 goes not to Vss but Vbi because of being discharged through the bipolar transistor Q12.

On the side of the Bi-CMOS inverter circuit 11, when the voltage of the [L] level is applied to the input point a14, the NMOS transistor M11 is switched OFF, the output point a15 of the CMOS inverter I11 becomes a Vcc level, and the NMOS transistor N11 is switched ON. The bipolar transistor Q14 is thereby switched OFF. The base of the bipolar transistor Q13 is charged with the voltage up to Vbi, and the bipolar transistor Q13 is thereby switched ON, with the result that an output point a16 is charged. At this time, an electric potential at the output point a16 is charged through the bipolar transistor Q13 and therefore becomes (Vcc–Vbi) lower by Vbi than Vcc.

FIG. 13A shows potential variations at the output terminal a14 when inputting an [L] level voltage after inputting an [H] level voltage to the input terminal of the BiCMOS inverter circuit 10 of FIG. 14. As stated above, the output voltage changes from Vbi to (Vcc–Vbi) but does not change from Vss to Vcc as in the case of the output of the CMOS inverter circuit.

Thus, the output of the conventional BiCMOS circuit does not exhibit a full swing but merely changes from Vbi to (Vcc–Vbi).

Furthermore, in the Bi-CMOS inverter circuit 10 illustrated in FIG. 14, when inputting the [L] level voltage to the input point a11, the condition necessary for effecting the discharging from the output a16 in the BiCMOS inverter circuit 11 is that the NMOS transistor M11 is switched ON, and the base of the bipolar transistor Q14 is charged with the voltage up to Vbi. Additionally, at this time, the NMOS transistor N11 and the bipolar transistor Q13 are kept OFF. Herein, the NMOS transistor M11 is switched ON, and, for this purpose, it is required that a difference between a gate voltage (Vcc–Vbi) and a source voltage (Vbi) be larger than the threshold value VTHN of the NMOS transistor M11. This is expressed by the following formula:

$$Vcc \geq 2Vbi + VTHN$$

However, with a decreasing tendency of the power supply voltage in recent years, it is difficult to ensure this relationship. Hence, it is also difficult to restrain a deterioration in terms of the delay time in the conventional Bi-CMOS inverter circuit, and a normal circuit operation cannot be secured.

Moreover, a source potential of the NMOS transistor M11 comes to Vbi owing to the bipolar transistor Q14, and, therefore, a problem arises, wherein the threshold value VTHN of the NMOS transistor M11 is larger due to a back gate effect than when the source potential is Vss.

Thus, with miniaturized transistors, decreasing the power supply voltage is desired in terms of a problem pertaining to a reliability on a MOS hot carrier and a gate oxide film. While on the other hand, it is impossible to prevent the deterioration in terms of the delay time due to the reduced voltage in the conventional Bi-CMOS inverter circuit.

SUMMARY OF THE INVENTION

It is a primary object of the present invention, which was devised to obviate the problems given above, to provide a Bi-CMOS circuit capable of normally operating even at a low voltage without causing any deterioration in delay time and keeping a predominance over a CMOS circuit.

According to the present invention, there is provided a Bi-CMOS circuit comprising:

an input terminal;

an output terminal;

a CMOS circuit for inverting data applied to said input terminal;

a first bipolar transistor, having a base connected to an output point of said CMOS circuit, a collector connected to a power supply voltage and an emitter connected to said output terminal, for charging said output terminal;

a second bipolar transistor, having a collector connected to said output terminal, for discharging said output terminal, and an emitter grounded;

a first MOS transistor of one conductivity type connected in parallel between the base and the collector of said second bipolar transistor;

a second MOS transistor of one conductivity type connected in series between said first conductive type MOS transistor and the ground and having a gate connected to an output point of said CMOS circuit;

a third MOS transistor of one conductivity type connected between said input terminal and the gate of said first MOS transistor and having a gate to which a first reference voltage is applied; and a fourth MOS transistor of inverse conductivity type connected between said first reference voltage and a gate of said first MOS transistor.

According to this Bi-CMOS circuit, an output of the CMOS circuit is given to a base of a first NPN type bipolar transistor having a collector connected to a power supply, and an emitter thereof serves as an output terminal. A second NPN type bipolar transistor having a collector serving as this output terminal and an emitter serving as a ground potential acts to discharge the output terminal. The first NMOS transistor is connected in parallel between the base and the collector of the second bipolar transistor. The second NMOS transistor controlled by an output of the CMOS circuit is connected in series to this first NMOS transistor. An input signal is applied via a third NMOS transistor to a gate of the first NMOS transistor. Further, there is provided a PMOS transistor controlled by a constant voltage or an output of the CMOS circuit in order to supply a predetermined potential. Hence, when a voltage of an [H] level is inputted to the CMOS circuit, the PMOS transistor is switched ON, and the gate of the first NMOS transistor goes to Vcc, thereby ensuring the operation at a lower voltage than in the prior art. Further, the third NMOS transistor works to reduce a capacitance connected to the gate of the first NMOS transistor, and therefore the gate of the first NMOS transistor is easily charged up to Vcc.

BRIEF DESCRIPTION OF THE DRAWINGS

Other objects and advantages of the present invention will become apparent during the following discussion in conjunction with the accompanying drawings, in which:

FIG. 3 is a circuit diagram illustrating an embodiment in which the BiCMOS inverter circuits according to the present invention are connected in series;

FIG. 4 is a circuit diagram illustrating an embodiment in which the BiCMOS inverter circuits according to the present invention are connected in series;

FIG. 5 is a circuit diagram illustrating an embodiment of a Bi-CMOS NAND circuit according to the present invention;

FIG. 6 is a circuit diagram illustrating an embodiment of the Bi-CMOS NAND circuit according to the present invention;

FIG. 9 is a circuit diagram showing an embodiment of a Bi-CMOS NOR circuit according to the present invention;

FIG. 10 is a circuit diagram showing an embodiment of the Bi-CMOS NOR circuit according to the present invention;

FIG. 11 is a circuit diagram showing an embodiment of the Bi-CMOS NOR circuit according to the present invention;

FIG. 12 is a circuit diagram showing an embodiment of the Bi-CMOS NOR circuit according to the present invention;

DETAILED DESCRIPTION OF THE PREFERRED EMBODIMENTS

Some embodiments of the present invention will hereinafter be described with reference to the drawings.

Figure 1:
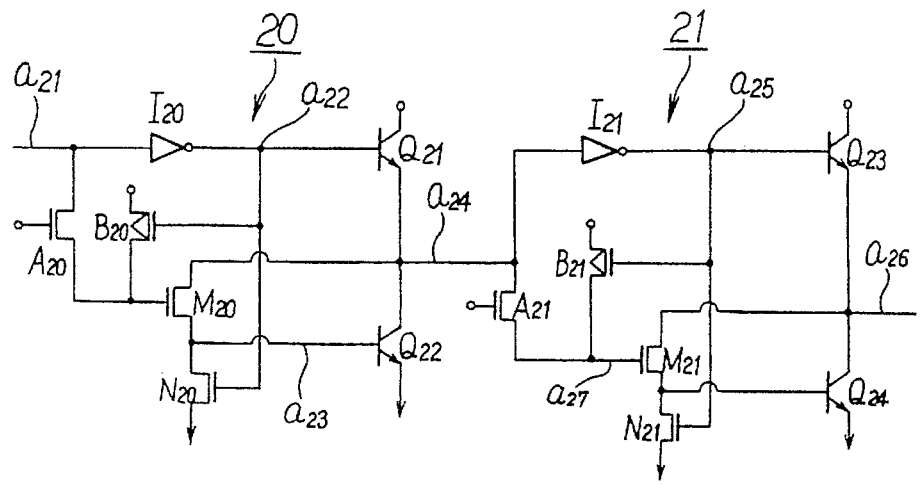
FIG. 1 is a circuit diagram illustrating an embodiment in which Bi-CMOS inverter circuits according to the present invention are connected in series.
Figure 14:
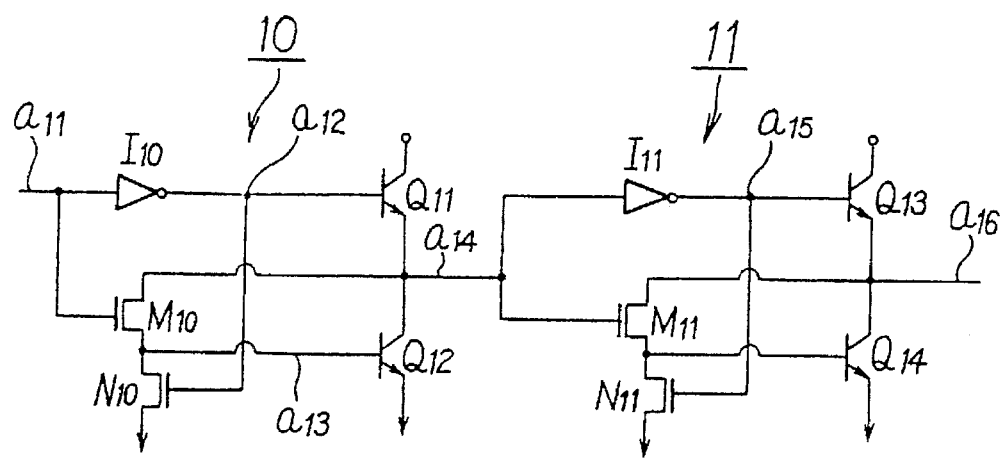
FIG. 14 is a circuit diagram showing an example where conventional Bi-CMOS inverter circuits are connected in series.

FIG. 1 is a circuit diagram showing one embodiment of the present invention. FIG. 1 illustrates two BiCMOS inverter circuits 20, 21 connected in series as in the case of FIG. 14.

A Bi-CMOS inverter circuit 20 includes a CMOS inverter I20 connected to an input point a21, and an NPN bipolar transistor Q21 having its base connected to an output point a22 thereof to be controlled by an output of the CMOS inverter I20. The Bi-CMOS inverter circuit 20 also includes an emitter-grounded bipolar transistor Q22 having its collector connected to an emitter of the transistor Q21. A connecting point of these transistors serves as an output node a24, and, at the same time, an NMOS transistor M20 is connected in parallel between this output node a24 and the base of the transistor Q22. Further, a drain of an NMOS transistor N20 is connected to the base of the transistor Q22, while a source thereof is grounded. A gate of the NMOS transistor N20 is connected to the output point a22 of the inverter I20, and, at the same time, a drain of a P-channel MOS (PMOS) transistor B20 is connected to the gate of the NMOS transistor M20. A source of this PMOS transistor B20 is at a power supply voltage, and a gate thereof is connected to the output point a22 of the inverter I20. An NMOS transistor A20 whose gate is controlled by the power supply voltage is connected between the gate of the NMOS transistor M20 and the input point a21.

Similarly, a BiCMOS inverter circuit 21 includes a CMOS inverter I21 connected to an input point a24 and an NPN bipolar transistor Q23 having its base connected to an output point a25 thereof to be controlled by an output of the CMOS inverter I21. The BiCMOS inverter circuit 21 also includes an emitter-grounded bipolar transistor Q24 having its collector connected to an emitter of the transistor Q23. A connecting point of these transistors serves as an output node a26, and, at the same time, NMOS transistors M21, N21 that are connected in series are provided between this connecting point and the ground. A gate of the NMOS transistor N21 is connected to an output point a25 of the inverter I21 and, at the same time, connected to a gate of a PMOS transistor B21 connected between the power supply and a gate of the NMOS transistor M21. An NMOS transistor A21 whose gate is controlled by the power supply voltage is connected between an input point a24 and the gate of the NMOS transistor M21.

Next, the operation of this circuit will be explained.

When a voltage of an [L] level is applied to the input terminal a21, the bipolar transistor Q21 outputs (Vcc–Vbi) to the output node a24. Then, this potential (Vcc–Vbi) is applied to the CMOS inverter I21, with the result that a level at the output point a25 of the CMOS inverter goes to Vss. Hereupon, the PMOS transistor B21 is turned ON, whereby a node a27 connected to the gate of the NMOS transistor M21 is charged up to Vcc. The output point a26 is discharged, and, for this purpose, it is required that the NMOS transistor M21 be turned ON. It is because a base voltage of the bipolar transistor Q24 is stepped up to Vbi by turning ON the NMOS transistor M21, and, as a result of this, the bipolar transistor Q24 can be switched ON.

At this time, the NMOS transistor N21 and the bipolar transistor Q23 are kept OFF because of the node a25 being Vss. Herein, for switching ON the NMOS transistor M21, it is required that a potential difference between the gate (Vcc) and the source (Vbi) be larger than a threshold value VTHN of the NMOS transistor M21.

Namely, the following relationship is required to be satisfied:

$$Vcc \geq Vbi + VTHN$$

In a comparison with the same relationship in the conventional circuit, a required voltage of the power supply voltage Vcc is lower by Vbi, and the power supply voltage can be therefore set still lower. Further, owing to the NMOS transistor A21, there is lessened a time needed for charging the node a27 up to Vcc from (Vcc–Vbi) or (Vcc–VTHN) since the PMOS transistor B21 has been switched ON.

It is because a junction capacitance of the anterior BiCMOS inverter circuit 20, a gate capacitance of the CMOS inverter I21 and a wiring capacitance of the I/O terminal a24 are reduced apparently due to the NOMS transistor A21. At this time, the electric potential of the I/O terminal a24 is (Vcc–VTHN) or (Vcc–Vbi).

Figure 13:
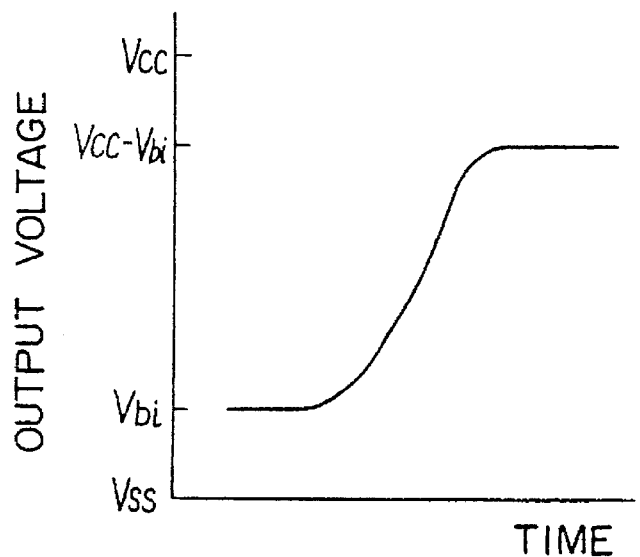
FIG. 13A is a graphic chart showing characteristic obtained by the conventional Bi-CMOS circuit.
FIG. 13B is a graphic chart showing a characteristic obtained by the Bi-CMOS circuit according to the present invention.
Figure 13:
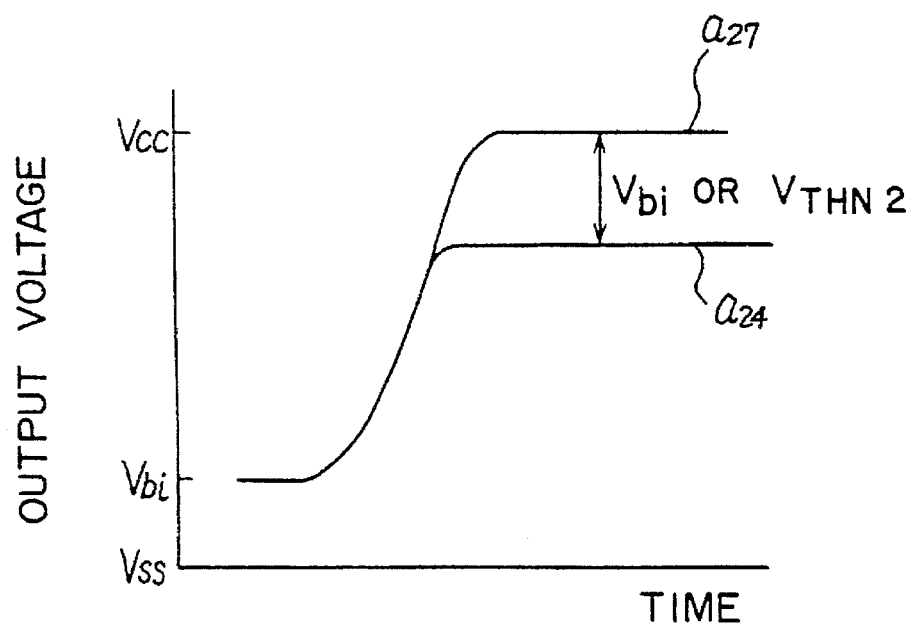

FIG. 13B is a graphic chart showing variations in the electric potential at the nodes a24, a27 when inputting a voltage of the [L] level after inputting a voltage of the [H] level to the input terminal a21 of the BiCMOS inverter circuit 20 of FIG. 1. As shown, the node a27 has a swing width becoming larger by Vbi than in the case of the conventional Bi-CMOS inverter circuit.

Figure 2:
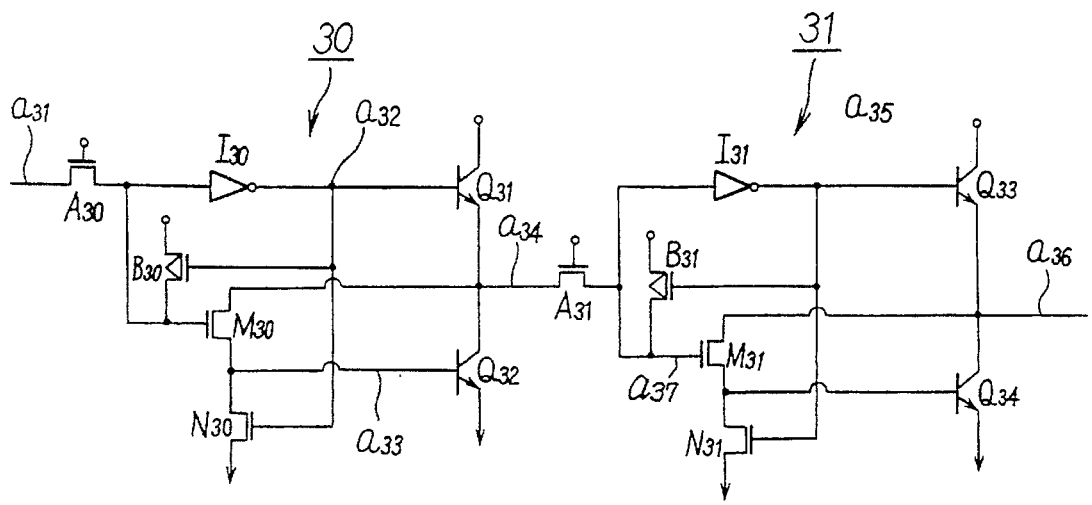
FIG. 2 is a circuit diagram illustrating an embodiment in which the Bi-CMOS inverter circuits according to the present invention are connected in series.

Next, an embodiment shown in FIG. 2 corresponds to a modified embodiment of the embodiment of FIG. 1, wherein the corresponding elements are suffixed with numerals in the thirties. In this embodiment also, NMOS transistors corresponding to the NMOS transistors A20, A21 in FIG. 1 are marked with A30, A31. Unlike the case of FIG. 1, however, the NMOS transistor A30 is interposed between an input point a31 and a CMOS inverter I30, while the NMOS transistor A31 is interposed between an input point a34 and a CMOS inverter I31. A connecting point between the NMOS transistor A30 and the CMOS inverter I30 is connected to a gate of an NMOS transistor M30, while a connecting point between the NMOS transistor A31 and the CMOS inverter I31 is connected to a gate of the NMOS transistor M31.

Based on such a construction, when an input potential of a node a34 defined as an input point of the BiCMOS inverter 31 becomes (Vcc–Vbi) as in the case of FIG. 1, a PMOS transistor B31 is switched ON, and, therefore, the node a37 is charged up to Vcc. With this operation, the electric potential inputted to the CMOS inverter I31 is increased up to Vcc from (Vcc–Vbi) or (Vcc–VTHN), and the same operation as that in FIG. 1 can be actualized.

Next, an embodiment illustrated in FIG. 3 also corresponds to a modified embodiment of the embodiment of FIG. 1, wherein the corresponding elements are suffixed with numerals in the forties. In this embodiment, there are provided PMOS transistors B40, B41 corresponding to the PMOS transistors B20, B21 in FIG. 1, but, unlike the case of FIG. 1, gates thereof are grounded.

In accordance with this embodiment, the gate of the PMOS transistor B41 is not connected to an output of a CMOS inverter I41 but is at a ground potential, and, hence, the PMOS transistor B41 is kept ON irrespective of a level of an input node a44.

Accordingly, it follows that the time needed for charging the node a47 up to Vcc is reduced.

An embodiment illustrated in FIG. 4 is a combination of the embodiments of FIGS. 2 and 3. As in the same way with the above-mentioned, the elements corresponding to those in FIG. 1 are suffixed with numerals in the fifties. In this embodiment, a BiCMOS inverter 50 is constructed such that an NMOS transistor A50 is connected between an input node a51 and a CMOS inverter I50, and a connecting point between the NMOS transistor A50 and the CMOS inverter I50 is connected to a gate of the NMOS transistor M50, while a gate of the PMOS transistor B50 is grounded. Similarly, a Bi-CMOS inverter 51 is constructed such that an NMOS transistor A51 is connected between an input node a54 and a CMOS inverter I51, and a connecting point between the NMOS transistor A51 and the CMOS inverter I51 is connected to a gate of the NMOS transistor M51, while a gate of the PMOS transistor B51 is grounded.

In this embodiment also, the time necessary for charging an output node a57 up to Vcc is reduced.

In Figures subsequent to FIG. 4, for simplicity, only the anterior BiCMOS inverter is illustrated.

Referring to FIG. 5, a NAND gate NA6 is provided in place of the CMOS inverter I20 based on the construction of FIG. 1, and two inputs thereof are connected via NMOS transistors A60, A61 to gates of NMOS transistors M60, M61. These NMOS transistors M60, M61 are connected in series to an NMOS transistor N60. A gate of the NMOS transistor M60 is connected to a power supply via a PMOS transistor B60 controlled by an output of a NAND gate NA6. A gate of the NMOS transistor M61 is connected to the power supply via a PMOS transistor B61 controlled by an output of the NAND gate NA6.

In the operation of this circuit, the two elements provided corresponding to the two inputs operate the same as that in FIG. 1.

In accordance with an embodiment illustrated in FIG. 6, as in the same way with the embodiment of FIG. 2, NMOS transistors A70, A71 are connected between an input point and a NAND gate NA7 in the embodiment using the NAND gate shown in FIG. 5.

Figure 7:
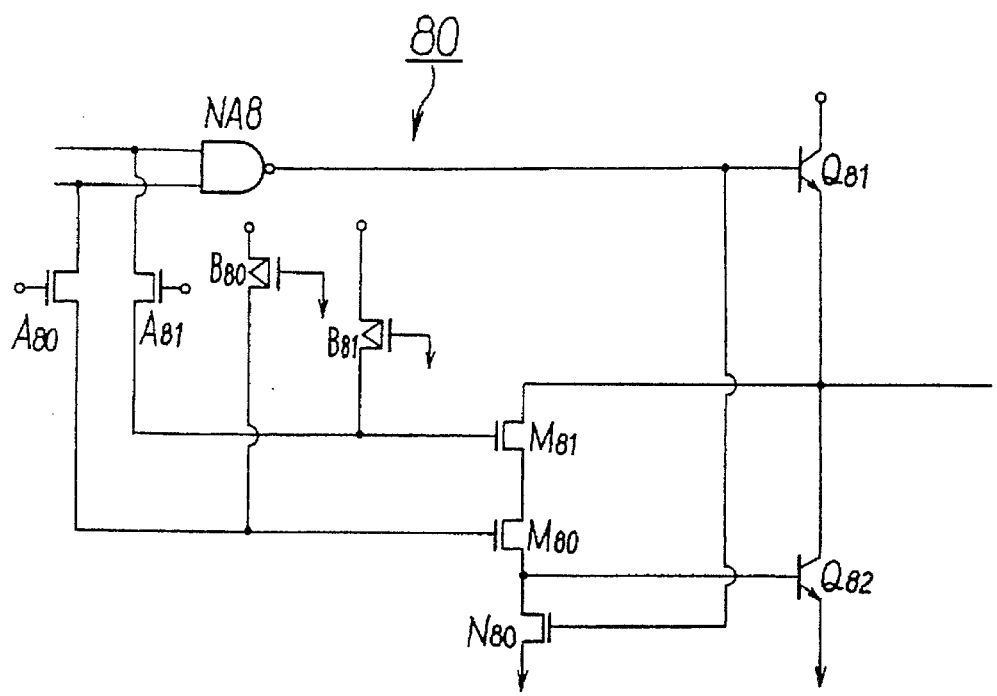
FIG. 7 is a circuit diagram illustrating an embodiment of the Bi-CMOS NAND circuit according to the present invention.

In accordance with an embodiment illustrated in FIG. 7, as in the same way with the embodiment of FIG. 3, gates of PMOS transistors B80, B81 are grounded in the embodiment using the NAND gate shown in FIG. 5.

Figure 8:
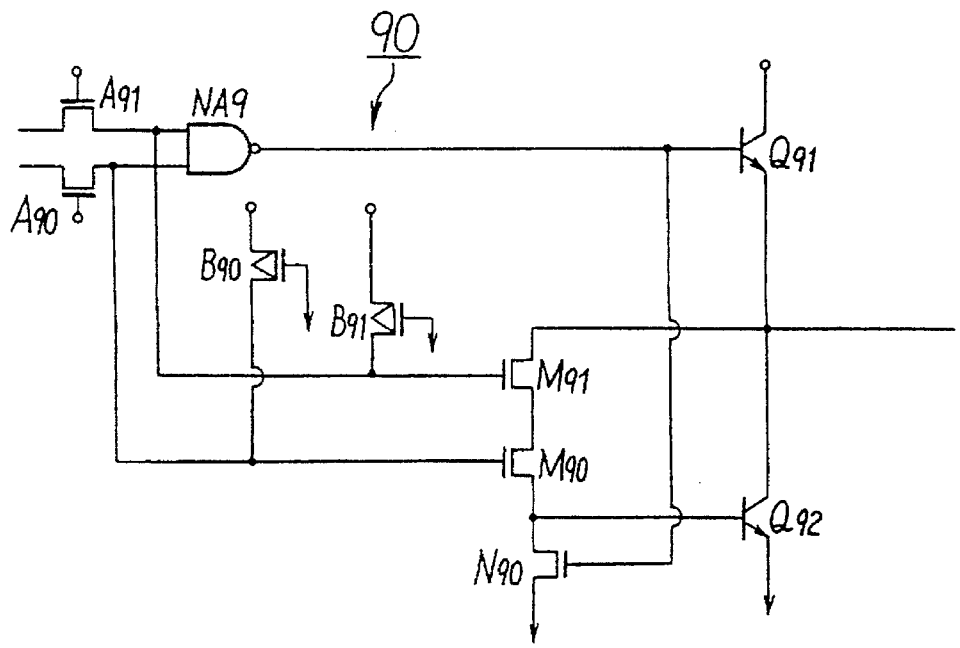
FIG. 8 is a circuit diagram illustrating an embodiment of the Bi-CMOS NAND circuit according to the present invention.

In accordance with an embodiment illustrated in FIG. 8, corresponding to the embodiment of FIG. 4, NMOS transistors A90, A91 are provided on the input side of the NAND gate in the embodiment using the NAND gate shown in FIG. 5. Further, gates of PMOS transistors B90, B91 are grounded.

Embodiments of FIGS. 9 through 11 correspond to the embodiments of FIGS. 5 through 8, wherein NOR gates are employed instead of the NAND gates.

In these embodiments, NMOS transistors M100 and M101, M110 and M111, M120 and M121, M130 and M131, which are respectively connected in parallel, are connected to NMOS transistors N100, N110, N120, N130, corresponding to NOR gates.

As in the case of the NAND gates, these elements corresponding to the respective inputs operate as explained in FIG. 1.

As discussed above, according to the present invention, there can be performed the operation at a lower voltage than in the conventional Bi-CMOS inverter circuit and at a higher speed than the ordinary CMOS circuit.

It is apparent that, in this invention, a wide range of different working modes can be formed based on the invention without deviating from the spirit and scope of the invention. This invention is not restricted by its specific working modes except being limited by the appended claims.

What is claimed is:

1. A Bi-CMOS circuit comprising;
   an input terminal;
   an output terminal;
   a CMOS circuit for inverting data applied to said input terminal;
   a first bipolar transistor having a base connected to an output of said CMOS circuit, a collector connected to a power supply voltage, and an emitter connected to said output terminal for charging said output terminal;
   a second bipolar transistor having a collector connected to said output terminal for discharging said output terminal, and an emitter connected to ground;
   a first MOS transistor of a first conductivity type connected between a base of said second bipolar transistor and the collector of said second bipolar transistor;
   a second MOS transistor of said first conductivity type connected between said first MOS transistor and the ground, and having a gate connected to the output of said CMOS circuit;
   a third MOS transistor of said first conductivity type connected between said input terminal and a gate of said first MOS transistor, the third MOS transistor having a gate to which a first reference voltage is applied; and
   a fourth MOS transistor of a second conductivity type, which is opposite to the first conductivity type, connected between said first reference voltage and the gate of said first MOS transistor,
   wherein a gate of said fourth MOS transistor is connected to the output of said CMOS circuit.

2. A Bi-CMOS circuit according to claim 1, wherein the gate of said first MOS transistor is directly connected to said CMOS circuit.

3. A Bi-CMOS circuit according to claim 1, wherein said input terminal is directly connected to said CMOS circuit.

4. A Bi-CMOS circuit according to claim 2, wherein said CMOS circuit is an inverter.

5. A Bi-CMOS circuit comprising:
   an input terminal;
   an output terminal;
   a CMOS circuit for inverting data applied to said input terminal;
   a first bipolar transistor having a base connected to an output of said CMOS circuit, a collector connected to a power supply voltage, and an emitter connected to said output terminal for charging said output terminal;
   a second bipolar transistor having a collector connected to said output terminal for discharging said output terminal, and an emitter connected to ground;
   a first MOS transistor of a first conductivity type connected between a base of said second bipolar transistor and the collector of said second bipolar transistor;
   a second MOS transistor of said first conductivity type connected between said first MOS transistor and the ground, and having a gate connected to the output of said CMOS circuit;
   a third MOS transistor of said first conductivity type connected between said input terminal and a gate of said first MOS transistor, the third MOS transistor having a gate to which a first reference voltage is applied; and
   a fourth MOS transistor of a second conductivity type, which is opposite to the first conductivity type, connected between said first reference voltage and the gate of said first MOS transistor,
   wherein a gate of said fourth MOS transistor is connected to a second reference voltage.

6. A Bi-CMOS circuit according to claim 5, wherein the gate of said first MOS transistor is directly connected to said CMOS circuit.

7. A Bi-CMOS circuit according to claim 5, wherein said input terminal is directly connected to said CMOS circuit.

8. A Bi-CMOS circuit comprising:
   an input terminal;
   an output terminal;
   a CMOS circuit coupled to the input terminal;
   a first bipolar transistor having a base connected to an output of said CMOS circuit, a collector connected to a power supply voltage, and an emitter connected to said output terminal for charging said output terminal;
   a second bipolar transistor having a collector connected to said output terminal for discharging said output terminal, and an emitter connected to ground;
   a first MOS transistor of a first conductivity type coupled between a base of said second bipolar transistor and the collector of said second bipolar transistor;
   a second MOS transistor of said first conductivity type connected between said first MOS transistor and the ground, and having a gate connected to the output of said CMOS circuit;
   a third MOS transistor of said first conductivity type connected between said input terminal and a gate of said first MOS transistor, the third MOS transistor having a gate to which a first reference voltage is applied; and
   a fourth MOS transistor of a second conductivity type, which is opposite to the first conductivity type, connected between said first reference voltage and the gate of said first MOS transistor,
   wherein a gate of said fourth MOS transistor is connected to the output of said CMOS circuit,
   the gate of said first MOS transistor is directly connected to an input of said CMOS circuit, and
   said CMOS circuit is a NAND gate.

9. A Bi-CMOS circuit comprising:
   a first input terminal;
   an output terminal;

a CMOS circuit coupled to said first input terminal;

a first bipolar transistor having a base connected to an output of said CMOS circuit, a collector connected to a power supply voltage, and an emitter connected to said output terminal;

a second bipolar transistor having a collector connected to said output terminal for discharging said output terminal, and an emitter connected to ground;

a first MOS circuit including at least a first MOS transistor of a first conductivity type, said first MOS transistor coupled between a base of said second bipolar transistor and the collector of said second bipolar transistor;

a second MOS transistor of said first conductivity type connected between said first MOS transistor and the ground, and having a gate connected to the output of said CMOS circuit;

a second MOS circuit including at least a third MOS transistor of said first conductivity type, the third MOS transistor connected between said first input terminal and a gate of said first MOS transistor, the third MOS transistor having a gate to which a first reference voltage is applied; and a third MOS circuit including at least a fourth MOS transistor of a second conductivity type, which is opposite to the first conductivity type, the fourth MOS transistor connected between said first reference voltage and the gate of said first MOS transistor.

10. A Bi-CMOS circuit according to claim 9, further comprising:

a second input terminal, wherein said CMOS circuit is a NAND gate, and the first and second input terminals are coupled to inputs of said NAND gate.

11. A Bi-CMOS circuit according to claim 10, wherein said first MOS circuit further includes a fifth MOS transistor connected in series with said first MOS transistor, said first and fifth MOS transistors being coupled to two inputs of said NAND gate, said second MOS circuit further includes a sixth MOS transistor, said third and sixth MOS transistors being coupled to the two inputs of said NAND gate, and said third MOS circuit further includes a seventh MOS transistor, said fourth and seventh MOS transistors being coupled to the two inputs of said NAND gate.

12. A Bi-CMOS circuit according to claim 11, wherein the gate of said first MOS transistor is directly connected to one of the inputs of said NAND gate, and the gate of said fifth MOS transistor is directly connected to another of the inputs of said NAND gate.

13. A Bi-CMOS circuit according to claim 11, wherein one of said input terminals is directly connected to one of said inputs of said NAND gate, and another of said input terminals is directly connected to another of said inputs of said NAND gate.

14. A Bi-CMOS circuit according to claim 9, further comprising:

a second input terminal, wherein said CMOS circuit is a NOR gate, and the first and second input terminals are coupled to inputs of said NOR gate.

15. A Bi-CMOS circuit according to claim 14, wherein said first MOS circuit further includes a fifth MOS transistor connected in parallel with the first MOS transistor, the first and fifth MOS transistors being coupled to two inputs of said NOR gate, said second MOS circuit further includes a sixth MOS transistor, said third and sixth MOS transistors being coupled to the two inputs of said NOR gate, and said third MOS circuit further includes a seventh MOS transistor, the fourth and the seventh MOS transistors being coupled to the two inputs of said NOR gate.

16. A Bi-CMOS circuit according to claim 15, wherein the gate of said first MOS transistor is directly connected to one of the inputs of said NOR gate, and the gate of said fifth MOS transistor is directly connected to another of the inputs of said NOR gate.

17. A Bi-CMOS circuit according to claim 15, wherein one of said input terminals is directly connected to one of said inputs of said NOR gate, and another of said input terminals is directly connected to another of said inputs of said NOR gate.

18. A Bi-CMOS circuit comprising:

a first input terminal;

an output terminal;

a CMOS circuit coupled to said first input terminal;

a first bipolar transistor having a base connected to an output of said CMOS circuit, a collector connected to a power supply voltage, and an emitter connected to said output terminal;

a second bipolar transistor having a collector connected to said output terminal for discharging said output terminal, and an emitter connected to ground;

a first MOS circuit including at least a first MOS transistor of a first conductivity type, said first MOS circuit connected between a base of said second bipolar transistor and the collector of said second bipolar transistor;

a second MOS transistor of said first conductivity type connected between said first MOS circuit and the ground, and having a gate connected to the output of said CMOS circuit;

a second MOS circuit including at least a third MOS transistor of said first conductivity type having a gate to which a first reference voltage is applied, the second MOS circuit connected to said first input terminal and said first MOS circuit; and a third MOS circuit including at least a fourth MOS transistor of a second conductivity type, which is opposite to the first conductivity type, the third MOS circuit connected between said first reference voltage and said first MOS circuit.

19. A Bi-CMOS circuit according to claim 18, wherein said third MOS transistor is connected between the gate of said first MOS transistor and a node which connects said first input terminal and said CMOS circuit.

20. A Bi-CMOS circuit according to claim 18, wherein said CMOS circuit is an inverter.

21. A Bi-CMOS circuit according to claim 18 further comprising a second input terminal, wherein said CMOS circuit is a NAND gate, and said first and second input terminals are coupled to said NAND gate.

22. A Bi-CMOS circuit according to claim 21, wherein said first MOS circuit further includes a fifth MOS transistor connected in series with said first MOS transistor, said first and fifth MOS transistors being coupled to two inputs of said NAND gate, said second MOS circuit further includes a sixth MOS transistor, said third and sixth MOS transistors being coupled to the two inputs of said NAND gate, and said third MOS circuit further includes a seventh MOS transistor, said fourth and seventh MOS transistors being coupled to the two inputs of said NAND gate.

23. A Bi-CMOS circuit according to claim 22, wherein said third and sixth MOS transistors of the second MOS circuit are each connected between one of the input terminals and one of the inputs of said NAND gate.

24. A Bi-CMOS circuit according to claim 22, wherein said third MOS transistor of the second MOS circuit is connected between the gate of the first MOS transistor of said first MOS circuit and a first node which connects one of said input terminals and one of said inputs of said NAND gate, and said sixth MOS transistor of the second MOS circuit is connected between a gate of the fifth MOS transistor of said first MOS circuit and a second node which connects another of said input terminals and another of said inputs of said NAND gate.

25. A Bi-CMOS circuit according to claim 18 further comprising a second input terminal, wherein said CMOS circuit is a NOR gate, and said first and second input terminals are coupled to said NAND gate.

26. A Bi-CMOS circuit according to claim 25, wherein said first MOS circuit further includes a fifth MOS transistor connected in parallel with the first MOS transistor, the first and fifth MOS transistors being coupled to two inputs of said NOR gate, said second MOS circuit further includes a sixth MOS transistor, said third and sixth MOS transistors being coupled to the two inputs of said NOR gate, and said third MOS circuit further includes a seventh MOS transistor, the fourth and the seventh MOS transistors being coupled to the two inputs of said NOR gate.

27. A Bi-CMOS circuit according to claim 26, wherein said third and sixth MOS transistors of the second MOS circuit are each connected between one of the input terminals and one of the inputs of said NOR gate.

28. A Bi-CMOS circuit according to claim 26, wherein said third MOS transistor of the second MOS circuit is connected between the gate of the first MOS transistor of said first MOS circuit and a first node which connects one of said input terminals and one of said inputs of said NOR gate, and wherein said sixth MOS transistor of the second MOS circuit is connected between a gate of the fifth MOS transistor of said first MOS circuit and a second node which connects another of said input terminals and another of said inputs of said NOR gate.

29. A Bi-CMOS circuit according to claim 18, wherein the third MOS transistor is connected between the first input terminal and a gate of the first MOS transistor; and the fourth MOS transistor is connected between the first reference voltage and the gate of the first MOS transistor.

* * * * *